(12) United States Patent
Tuominen (10) Patent No.: US 8,964,409 B2
(45) Date of Patent: Feb. 24, 2015

(54) ELECTRONIC MODULE WITH EMI PROTECTION

(75) Inventor: Risto Tuominen, Espoo (FI)

(73) Assignee: GE Embedded Electronics Oy, Helsinki (FI)

( * ) Notice: Subject to any disclaimer, the term of this patent is extended or adjusted under 35 U.S.C. 154(b) by 383 days.

(21) Appl. No.: 12/700,812

(22) Filed: Feb. 5, 2010

(65) Prior Publication Data

US 2010/0202127 A1 Aug. 12, 2010

(30) Foreign Application Priority Data

Feb. 6, 2009 (FI) ...................................... 20095110

(51) Int. Cl.
*H05K 9/00* (2006.01)
*H05K 1/18* (2006.01)
(Continued)

(52) U.S. Cl.
CPC ................ *H05K 1/185* (2013.01); *H01L 24/19* (2013.01); *H01L 24/20* (2013.01); *H01L 2224/04105* (2013.01); *H01L 2224/20* (2013.01); *H01L 2924/01002* (2013.01); *H01L 2924/01003* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01052* (2013.01); *H01L 2924/0106* (2013.01); *H01L 2924/01061* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01);

(Continued)

(58) Field of Classification Search
CPC ....................................................... H05K 1/185
USPC ................. 361/760, 763–766, 790–795, 800; 174/260–262
See application file for complete search history.

(56) References Cited

U.S. PATENT DOCUMENTS 6,131,269 A 10/2000 Lee et al.
6,370,013 B1 4/2002 Iino et al.
(Continued)

FOREIGN PATENT DOCUMENTS

EP 1 304 742 A2 4/2003
EP 1 515 365 A2 3/2005
(Continued)

*Primary Examiner* — Robert J Hoffberg
*Assistant Examiner* — Mukund G Patel
(74) *Attorney, Agent, or Firm* — Seppo Laine Oy; Joshua P. Wert (57) ABSTRACT

An electronic module with EMI protection is disclosed. The electronic module comprises a component (1) with contact terminals (2) and conducting lines (4) in a first wiring layer (3). There is also a dielectric (5) between the component (1) and the first wiring layer (3) such that the component (1) is embedded in the dielectric (5). Contact elements (6) provide electrical connection between at least some of the contact terminals (2) and at least some of the conducting lines (4). The electronic module also comprises a second wiring layer (7) inside the dielectric (5). The second wiring layer (7) comprises a conducting pattern (8) that is at least partly located between the component (1) and the first wiring layer (3) and provides EMI protection between the component (1) and the conducting lines (4).

20 Claims, 7 Drawing Sheets

(51) Int. Cl.
  *H01L 23/00* (2006.01)
  *H05K 1/02* (2006.01)
(52) U.S. Cl.
  CPC ............... *H01L2924/19041* (2013.01); *H01L 2924/19042* (2013.01); *H01L 2924/19043* (2013.01); *H01L 2924/30107* (2013.01); *H01L 2924/3025* (2013.01); *H05K 1/0218* (2013.01); *H05K 2201/0723* (2013.01); *H05K 2201/09318* (2013.01); *H05K 2201/10674* (2013.01); *H01L 2924/01006* (2013.01); *H01L 2924/01023* (2013.01); *H01L 2924/01024* (2013.01); *H01L 2924/01043* (2013.01); *H01L 2924/01047* (2013.01)
  USPC ............ 361/818; 361/761; 361/762; 361/763; 361/764; 361/800; 174/260; 174/261; 174/262; 174/263; 174/264

(56) References Cited

U.S. PATENT DOCUMENTS

| | | |
|---|---|---|
| 6,970,362 B1 | 11/2005 | Chakravorty |
| 6,991,966 B2 | 1/2006 | Tuominen |
| 7,045,719 B1 * | 5/2006 | Alexander et al. ............ 174/262 |
| 2003/0015342 A1 | 1/2003 | Sakamoto et al. |
| 2004/0027813 A1 | 2/2004 | Li |
| 2004/0245640 A1 * | 12/2004 | Tsukamoto et al. .......... 257/758 |
| 2005/0127519 A1 | 6/2005 | Scheuerlein et al. |
| 2006/0214278 A1 | 9/2006 | Martin |
| 2006/0278967 A1 | 12/2006 | Tuominen et al. |
| 2007/0158787 A1 * | 7/2007 | Chanchani .................... 257/619 |
| 2007/0166886 A1 | 7/2007 | Iihola et al. |
| 2007/0262430 A1 | 11/2007 | Ibaraki |
| 2007/0267136 A1 | 11/2007 | Tuominen et al. |
| 2008/0037199 A1 | 2/2008 | Fukudome et al. |
| 2008/0094805 A1 | 4/2008 | Tuominen et al. |
| 2008/0192450 A1 | 8/2008 | Tuominen et al. |
| 2008/0196930 A1 | 8/2008 | Tuominen et al. |
| 2008/0261338 A1 | 10/2008 | Ilhola et al. |
| 2008/0273314 A1 | 11/2008 | Cho et al. |
| 2008/0295326 A1 | 12/2008 | Tuominen et al. |
| 2009/0072404 A1 * | 3/2009 | Kikuchi et al. ............... 257/753 |
| 2009/0236141 A1 * | 9/2009 | Kim et al. ..................... 174/360 |
| 2010/0059853 A1 * | 3/2010 | Lin et al. ...................... 257/528 |

FOREIGN PATENT DOCUMENTS

| | | |
|---|---|---|
| WO | WO 2005/045902 A2 | 5/2005 |
| WO | WO 2005/057999 A1 | 6/2005 |

* cited by examiner

ELECTRONIC MODULE WITH EMI PROTECTION

TECHNICAL FIELD

The present invention relates to electronic modules including an embedded component, such as an active microchip or a passive component. In addition to the component, such electronic modules include at least one wiring layer and a dielectric enclosing the component.

In particular, the present invention relates to electronic modules taken into account consideration relating to possible electromagnetic interference affecting the embedded component and the conducting lines in the wiring layer.

BACKGROUND ART

U.S. Pat. No. 6,131,269 (Lee et al.) teaches that there is a problem in the field of packaging radio-frequency (RF) and millimeter-wave circuit components. The difficulty is in that parallel RF paths reduce RF signal transfer efficiency because RF energy is lost through coupling to the adjoining RF path. The publication is concerned with providing electrical or electromagnetic isolation in a lateral direction, that is, in directions parallel to the plane of the substrate. Isolation in a direction perpendicular to the substrate is provided conventionally by the metal backplane on one face of the substrate, and by a layer of metalization on the upper surface. This is achieved by forming a continuous metal isolation wall between circuit modules to increase lateral electrical isolation of closely adjacent RF or millimeter-wave circuit components mounted on a single substrate.

U.S. Pat. No. 6,991,966 (Tuominen) discloses providing a shield around the embedded component that protects against electromagnetic interference. The shield can surround the component almost entirely.

DISCLOSURE OF INVENTION

It is an object of the present invention to create a new structure for electronic modules that can provide protection against electromagnetic interference in the module.

According to an aspect of the invention, there is provided an electronic module comprising conducting lines in a first wiring layer. Furthermore, the electronic module comprises a second wiring layer with a conducting pattern, at least of a portion of which is located between the component and the first wiring layer. This conducting pattern forms an EMI shield between the component and the first wiring layer. The contact elements are also provided that pass through the second wiring layer in order to form the necessary electrical connections between the component and the conducting lines in the first wiring layer.

The present invention makes it possible to construct an electronic module, wherein the conducting lines connected to the component are lead over the component without a risk of mutual electromagnetic interference. This is a considerable advantage and allows several useful embodiments.

For example, there are also embodiments that allow designing component packages and other electronic modules even such that signal lines and terminal pads are located over the component. According to embodiments, signal lines and terminal pads can even locate over an active surface of an embedded microcircuit. Therefore, considerable savings in size and wiring area may be achieved. Flexibility of design is also increased by means of the embodiments.

BRIEF DESCRIPTION OF DRAWINGS

For a more complete understanding of the present invention and the advantages thereof, the invention is now described with the aid of the examples and with reference to the following drawings, in which.

BEST MODE FOR CARRYING OUT THE INVENTION

FIGS. 1 to 6 present six embodiments of electronic modules. In the embodiments of FIGS. 1 to 6, the electronic module includes a chip 1 that has contact lands 2 on its active surface. Thus, in the embodiments of FIGS. 1 to 6, a chip is used as the component 1. However, the component 1 does not need to be a chip but in general any suitable component 1 can be used in the embodiments.

The chip 1 described in FIGS. 1 to 6 can be any semiconductor chip, such as a microcircuit. In case of a microcircuit, the chip 1 comprises pre-processed microelectronic devices on its active surface and typically a passivation layer over the microelectronic devices that protect the active surface of the chip. However, the chips 1 in the embodiments of FIGS. 1 to 6 are so called bare chips, i.e. chips that have not been subject to packaging process but are substantially in the form they left the semiconductor manufacturing process and the succeeding dicing. The chips may have pre-processed contact bumps on their contact lands 2 or be bumpless chips 1 without such contact bumps. Thus, the term contact land refers to the conducting surfaces processed in the semiconductor manufacturing plant. However, such contact lands 2 may have bump structures on them that have been manufactured by means of a bumping process.

Even though the embodiments of FIGS. 1 to 6 describe electronic modules containing the chips 1, the invention is not limited to using chips or microcircuits. The chip 1 can be, for example, any semiconductor component such as processor, memory chip, RF chip, etc. Instead of a chip, any suitable component can be used. Thus, the chip 1 in the described embodiments can be replaced with a LED, resistor, capacitor, inductor etc. if desired. All the components of suitable size and having suitably located contact lands 2 or corresponding terminals can be used in the described electronic modules.

In the embodiments of FIGS. 1 to 6, the electronic module comprises a first wiring layer 3 and a second wiring layer 7. The first and second wiring layers 3, 7 are patterned conductor layers usually made of copper. The patterning can be done by means of any patterning technology, such as by means of laser or photolithography together with chemical etching. In this document, the patterns in the first wiring layer 3 are called conducting lines 4 as they are typically used for conducting electrical signals or supply voltage. On the other hand, the patterns in the second wiring layer 7 are called just a first conducting pattern 8 as in some embodiments it serves only as a ground plane or a shield against electromagnetic interference. However, there are also embodiments wherein the first conducting pattern 8 in the second wiring layer 7 comprises also conducting lines for conducting electrical signals or supply voltage. These conducting lines in the second wiring layer 7 may be connected to the conducting lines of the other wiring layers, such as the conducting lines 4, by means of conductive vias.

In the embodiments of FIGS. 1 to 6, at least of a portion of the first conducting pattern 8 in the second wiring layer 7 is located between the chip 1 and the first wiring layer 3. This arrangement is to prevent cross talk between the chip 1 and the conducting lines 4 in the first wiring layer 3 that can be used as signal lines.

The electronic modules according to FIGS. 1 to 6 also comprises a dielectric 5 that supports the conducting lines 4 and the first conducting pattern 8. The dielectric 5 also fills the gap between the chip 1 and the first conducting pattern 8. The dielectric 5 serves as an electrical insulator and also as a mechanical structural element binding and attaching the chip 1, conducting lines 4 and the first conducting pattern 8 together to form as a single structural entity.

Furthermore, the electronic modules depicted in FIGS. 1 to 6 comprise contact elements 6 that provide electrical connection between at least some of the contact lands 2 of the chip 1 and at least some of the conducting lines 4 in the first wiring layer 3. These contact elements 6 can be made of metal, for instance. The contact elements 6 can be, for example, solid metal structures produced by chemical vapour deposition and/or electrolytic plating. The contact elements 6 can contain two or more metals as layers, for instance. It is also possible that the contact elements 6 are made of one metal only. Such one metal may be copper (Cu), for instance. In case the contact lands 2 are made of aluminium (Al) and the material of the contact elements 6 is mainly copper, it is beneficial to use an interlayer between the aluminium and copper. Such interlayer may contain at least one of: chrome (Cr), titanium-wolfram (TiW), nickel (Ni) and gold (Au).

Figure 1:
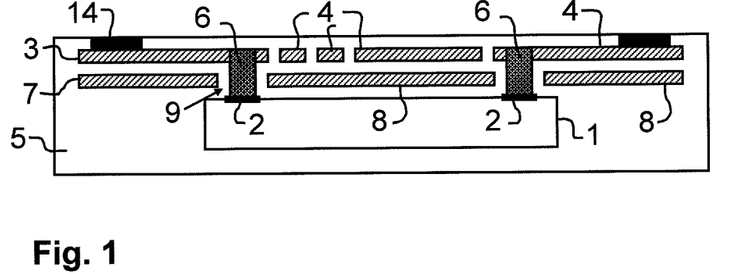
FIG. 1 presents a cross-section of an electronic module according to a first embodiment.

Now referring to FIG. 1, there is presented an electronic module according to a first embodiment. The electronic module according to the first embodiment may be a component package, for instance. A corresponding structure can also be used as an electronic module comprising two or several embedded chips 1, such as a circuit board.

Figure 2:
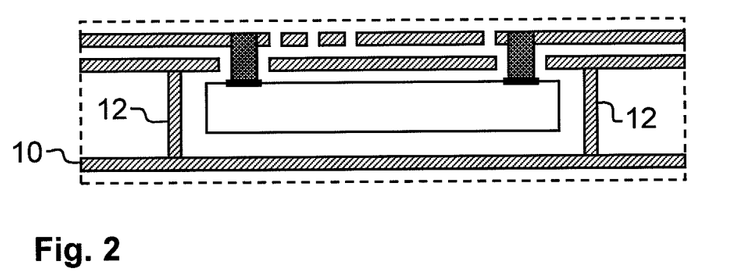
FIG. 2 presents a cross-section of an electronic module according to a second embodiment.

FIG. 2 shows a portion of an electronic module according to a second embodiment. Such a portion may be part of a component package or a circuit board, for instance.

Figure 3:
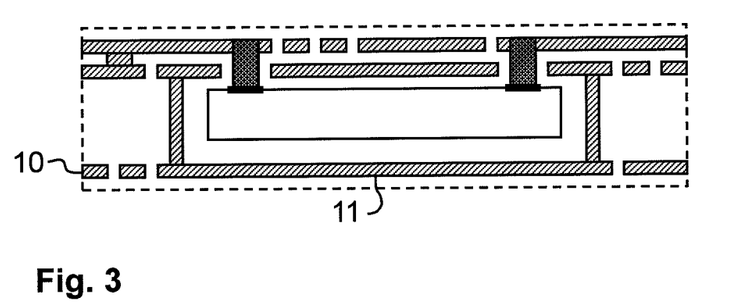
FIG. 3 presents a cross-section of an electronic module according to a third embodiment.
Figure 4:
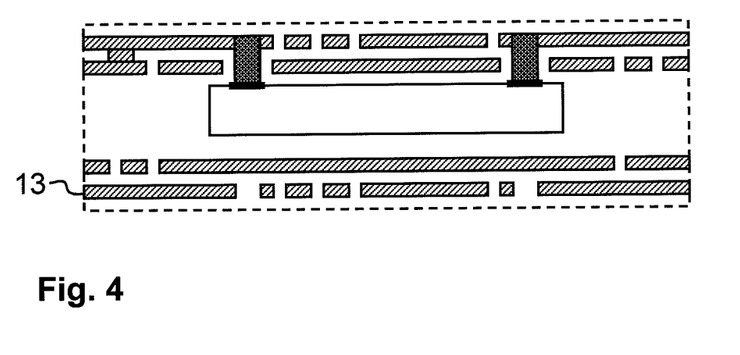
FIG. 4 presents a cross-section of an electronic module according to a fourth embodiment.

FIGS. 3 and 4 depict portions of electronic modules according to a third and fourth embodiment, respectively. As in the second embodiment, also the third and fourth embodiment may be used as parts of component packages or circuit boards, for instance.

In each of the first to fourth embodiments shown in FIGS. 1 to 4, the chip 1 is embedded in the dielectric 5. This is, however, not mandatory but also embodiments leaving the rear surface of the chip 1 (i.e. the surface opposite to the active surface) uncovered can be contemplated.

As shown by FIGS. 2 to 4, the electronic module may also comprise a third wiring layer 10 at the rear side of the chip 1 such that the chip 1 is enclosed between the second and third wiring layers 7, 10. Such a third wiring layer 10 may also be patterned to provide a second conducting pattern 11. As is evident for a person skilled in the art, further wiring layers can also be added, such as a fourth wiring layer shown in FIG. 4. In the embodiments shown by FIGS. 1 to 4, all the wiring layers are embedded in the dielectric 5. However, this is not mandatory but the outermost wiring layers may also run on the surface of the dielectric 5 and thus be exposed.

Figure 5:
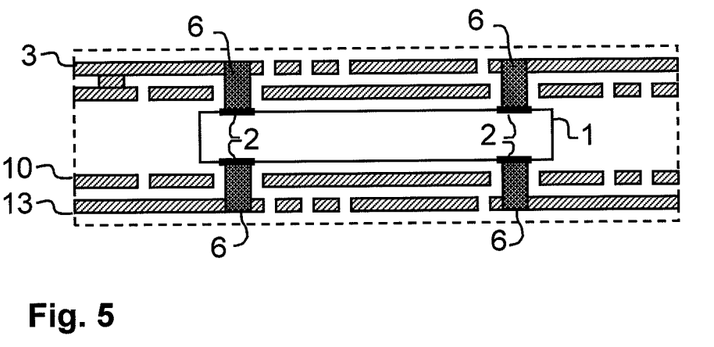
FIG. 5 presents a cross-section of an electronic module according to a fifth embodiment.

FIG. 5 shows a fifth embodiment having four wiring layers as in the embodiment of FIG. 4. In the embodiment of FIG. 5, the component 1 has contact terminals 2 at two sides of the component 1. The component is embedded such that at least one of the contact terminals 2 faces the first wiring layer 3 and at least another contact terminal 2 faces the fourth wiring layer 13. The electronic module comprises contact elements 6 at both sides of the component 1 such that the component is in direct electrical connection to both the first and fourth wiring layer 3 and 13 by means of the contact elements 6.

Figure 6:
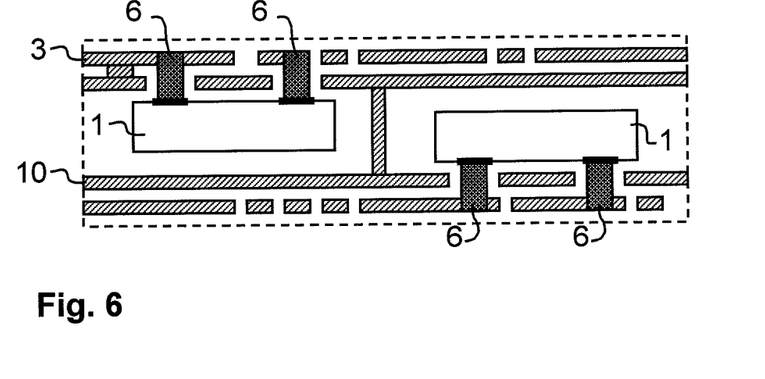
FIG. 6 presents a cross-section of an electronic module according to a sixth embodiment.

FIG. 6 shows a sixth embodiment, which also has four wiring layers such as the embodiments of FIGS. 4 and 5. The embodiment of FIG. 6 includes also at least one vertical conductor 12 as the embodiments described by reference to FIGS. 2 and 3. The embodiment of FIG. 6 comprises at least two components 1 such that the contact terminals 2 of the first component 1 face the first wiring layer 3 and are connected thereto by means of a first set of contact elements 6. In addition, the electronic module comprises at least one second components 1 such that the contact terminals 2 of the second component 1 face the fourth wiring layer 13 and are connected thereto by means of a second set of contact elements 6. In the embodiment of FIG. 6, the at least one vertical conductor 12 is located between the first and second components in order to prevent mutual interference between the components 1.

In both of the embodiments of FIGS. 5 and 6, also the third wiring layer 10 is patterned to form conducting patterns corresponding to the first conducting pattern 8 in the a second wiring layer 7. This means that also the conducting patterns in the third wiring layer 10 are designed to provide openings corresponding to the openings 9 described above and a portion that is located between the respective component 1 and the conducting lines in the fourth wiring layer 13. However, this is not necessary in case there is no need for EMI protection in the direction of the fourth wiring layer 13. In that case, the third wiring layer 10 can be omitted or used for wiring purposes, for instance.

The embodiments of FIGS. 1 to 6 exemplify only some of the various electronic modules that are readily contemplated by a person skilled in the art on the basis of this specification.

Most of the embodiments are described such that the embedded component 1 is a chip. The chip 1 may be of the type including microelectronic devices on its active surface. Then, in order to prevent cross talk between the microelectronic devices and the conducting lines 4, a portion of the first conducting pattern 8 in the second wiring layer 7 is located between the microelectronic devices and the conducting lines 4, as shown in the FIGS. 1 to 4, for instance. The first conducting pattern 8 can be connected to a ground potential.

Protection against electromagnetic interference can be further enhanced by providing vertical conductors 12 around the chip 1 as shown in FIGS. 2, 3 and 6. Such vertical conductors 12 are preferable connected to the second conducting pattern 11 and/or the first conducting pattern 8 in the second wiring layer 7. The vertical conductors 12 can also be grounded as well as the second conducting pattern 11 and the first conducting pattern 8. The configuration presented in FIGS. 2, 3 and 6 forms a shield around the chip 1 that protects the chip against interference from all directions. The shield can be designed such that it has only sufficiently small gaps in it in order to block the relevant frequencies of electromagnetic fields and radiation. Such gap may be formed between the vertical conductors and by the openings made for the contact elements 6, for instance.

The dielectric 5 in the embodiments of FIGS. 1 to 6 comprises at least two layers of dielectric material that are bonded together by lamination during the manufacturing process. The dielectric can also be formed by three, four or any desired number of such layers. In addition to the layer-form dielectric materials, the dielectric can also contain portions made of insulating adhesives, for instance. For example, the portion of the dielectric 5 between the active surface of the chip 1 and the first conducting pattern 8 can be conveniently made of electrically insulating adhesive, for instance. In general, the layers may contain mutually same dielectric material or materials, or may be of different dielectric materials. At least one of the layers may be, for example, an epoxy layer reinforced with glass fibres, such as a layer manufactured from FR4 sheet. Also other layers and materials can be used as is known in the circuit board manufacturing industry.

One feature relating to the dielectric 5 in the embodiments is that the dielectric encloses the component, such as the chip 1. The dielectric 5 may also enclose the conducting lines 4, the contact elements 6 and the first conducting pattern 8 and thereby bind them together as an embedded circuit structure.

As can be seen in FIGS. 1 to 6, the first conducting pattern 8 in the second wiring layer 7 defines at least one opening 9, and the contact elements 6 pass through said at least one opening 9. Many different configurations of the openings 9 are possible and some of these are described in more detail by reference to FIGS. 15 to 21. The openings 9 may be, for example, annular, round, groove-like or rectangular.

In the embodiments of FIGS. 1 to 6, the first and second wiring layers 3 and 7 are planar, and the contact elements 6 extend straight from the contact lands 2 to the respective conducting lines 4 in a direction perpendicular to the planar first and second wiring layers 3 and 7. Thus, the length of the contact elements 6 corresponds to the distance from the surface of the contact lands 2 to the respective conducting lines 4. Thus, the contact elements 6 are short. Short and straight contact elements 6 provide enhanced electrical properties compared to wire-bonded contact elements, for instance.

FIGS. 7 to 14 describe some possible manufacturing methods for manufacturing electronic modules according to embodiments. However, any suitable method can be used.

Figure 7:
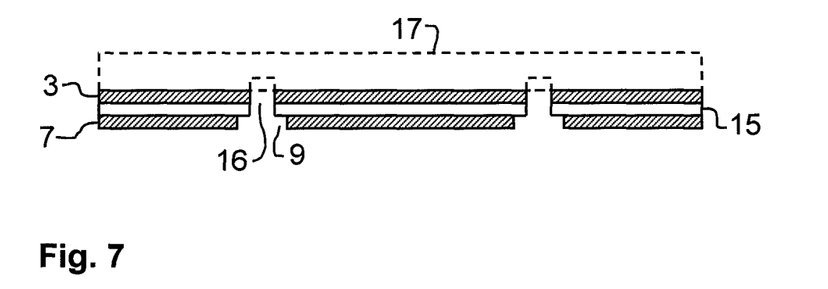
FIG. 7 presents, as a cross-section, one intermediate processing step when manufacturing an electronic module according to an embodiment.

In accordance with FIG. 7, it is possible to select a layered foil material as the starting material. The selected foil material can include, for example, two layers of copper and an insulating layer between them. One of the copper layers may serve to provide material for the first wiring layer 3, the other constituting metal for the second wiring layer 7. The thicknesses of the copper foils may be between 3-5 micrometers, for instance. The thicknesses of the first wiring layer 3 and the second wiring layer 7 may be equal or differ from each other. The thickness of the insulating layer is preferably less than 30 micrometers. In the embodiment of FIG. 7, the thickness of the insulating layer is 10 micrometers.

The foil material is then holed as shown in FIG. 7. Bigger holes in the Figure form the openings 9 of the electronic module. Such holes can be manufactured with one of several chemical or mechanical manufacturing methods. Possible methods include, e.g. selective chemical etching of copper and laser drilling the insulating layer; selective chemical etching of copper and chemical etching of the insulating layer; and laser drilling the foil material with different beam sizes. In addition to the openings 9 that penetrate the material of the second wiring layer 7, smaller holes are manufactured through the material of the first wiring layer 3. These holes are called contact holes 16 in this document. The contact holes 16 are smaller that the openings 9 and their projections on the plane of the second wiring layer 7 are totally within the openings 9. Furthermore, there is a gap designed between the projections of the contact holes 16 and the openings 9 in order to guarantee that the later manufactured contact elements 6 are not short-circuited to the second wiring layer 7. Instead, there is portion of the dielectric 5 in between. The size of the hole manufactured in the insulating layer 3 is however not critical at this stage. The hole is later filled with insulating adhesive when attaching the chip 1. In general, the hole manufactured in the insulating layer 3 is usually about of the same size than the contact holes 16 or the openings 9. Such hole structures can be produces by a sequence of laser drilling processes, for instance. For example, it is possible to use both $CO_2$ and UV laser processes to produce the desired sizes.

FIG. 7 shows also a carrier foil 17, which is drawn in dotted lines. The carrier foil 17 is totally optional but it may be provide certain benefits in the manufacturing process. The hole for the contact holes 16 may or may not penetrate the carrier foil 17, this has no effect to the outcome. Thus, the starting material can be a suitable foil with carrier, for instance. The carrier can be any suitable commercially available material, in any suitable thickness. In this example, the material of the carrier foil 17 is copper. The carrier foil 17 is later released from the above-described foil structure, facilitated by a release layer on the surface of the carrier foil 17 facing the insulating layer 3.

Figure 8:
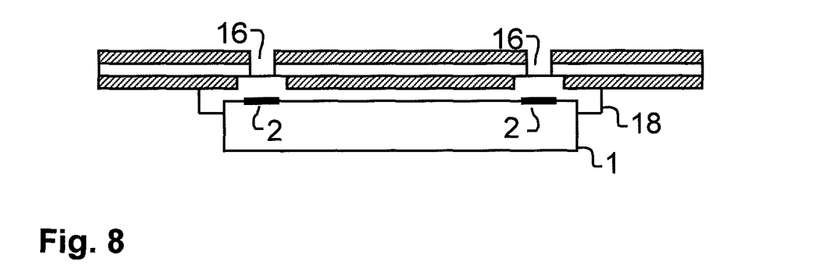
FIG. 8 presents another intermediate processing step after the step of FIG. 7.

FIG. 8 shows the next step of the process that includes attaching the chip 1. The chip 1 is aligned to the foil such that the contact lands 2 are correctly located with regard to the contact holes 16. The chip is attached to the foil with the aid of insulating adhesive 18. The chip may also have pre-fabricated contact bumps on its contact lands 12. Then, the contact bumps are aligned with regard to the contact holes 16.

Figure 9:
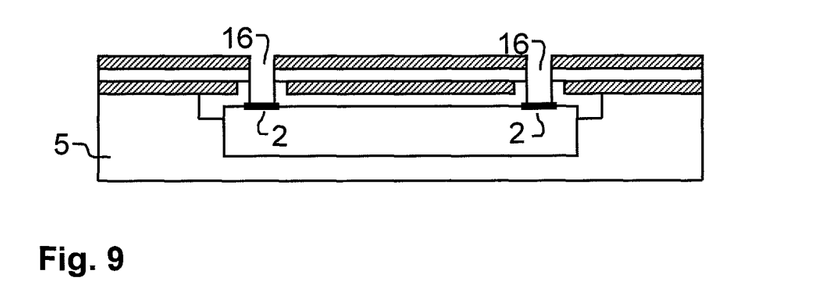
FIG. 9 presents a further intermediate processing step after the step of FIG. 8.

Next, the chip 1 is embedded in insulating material that forms part of the dielectric 5. This is shown in FIG. 9. The added insulating material may be prepreg, for instance. Then, the carrier foil 17 is removed, if applicable.

Next step is a micro via cleaning process by means of $CO_2$ laser ablation. During this step, the contact holes 16 are opened up to the surface of the contact lands 2 or other contact terminals, such as contact bumps. At the same time, also the surface of such contact lands 2 or terminals is cleaned.

Figure 10:
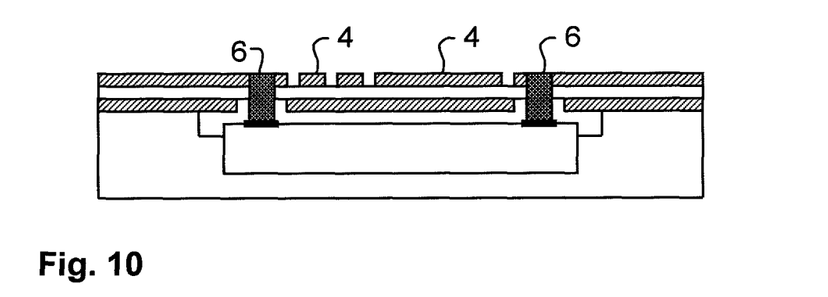
FIG. 10 presents a further processing step after the step of FIG. 9.

Then, a micro via metallization is performed, as shown in FIG. 10. This can be done by copper deposition to the micro via, for instance. During this step, the contact holes 16 are filled with one or more conducting materials, such as copper. The filled contact holes 16 form the contact elements 6. From the metallurgical point of view, such contact elements 6 extend from the surface of the contact lands 2 and into the hole in the first wiring layer 3. However, when referring to the height of the contact elements 6 in this document, the contact element 6 is thought to end at the surface of the first wiring layer 3, and the rest of the metal of the contact element 6 is considered as part of the conducting line 4 in the first wiring layer 3. This assumption is practical, but as stated already above, from the metallurgical point of view there is a hole in the conducting line 4 into which the material of the contact element 6 protrudes.

FIG. 10 shows also the core layer patterning step, in which the first wiring layer 3 is patterned to form the conducting lines 4. One of the patterning processes known in the art can be used.

From the module of FIG. 10, it is possible to continue by surface finishing step, solder mask and NI/Au plating or OSP, for instance.

FIGS. 11 to 14 describe some of the alternative manufacturing methods. However, several other manufacturing methods exist that can be used manufacture the electronic modules according to the embodiments.

Figure 11:
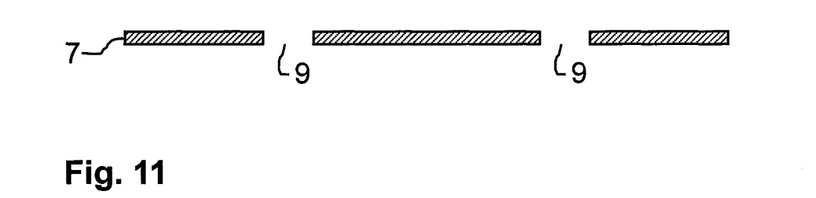
FIG. 11 presents, as a cross-section, one intermediate processing step when manufacturing an electronic module according to another embodiment.

FIG. 11 shows using a copper foil as a starting material. This copper foil is intended to provide the material of the second wiring layer 7 of the electronic module. The copper foil is holed to provide openings 9. This corresponds to the step described in context with FIG. 7 above.

Figure 12:
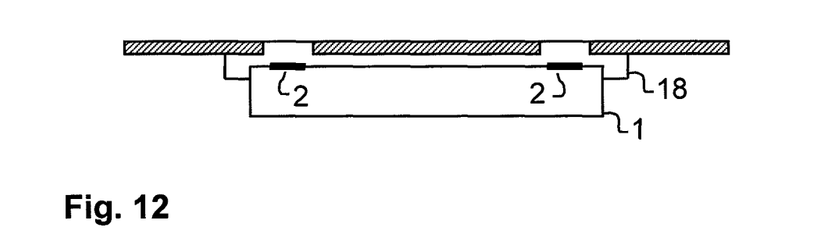
FIG. 12 presents another intermediate processing step after the step of FIG. 11.

FIG. 12 shows the next step of the process that includes attaching the chip 1. The chip 1 is aligned to the copper foil such that the contact lands 2 are correctly located with regard to the openings 9. The chip is attached to the foil with the aid of insulating adhesive 18. The chip may also have pre-fabricated contact bumps on its contact lands 12. Then, the contact bumps are aligned with regard to the contact holes 16.

Figure 13:
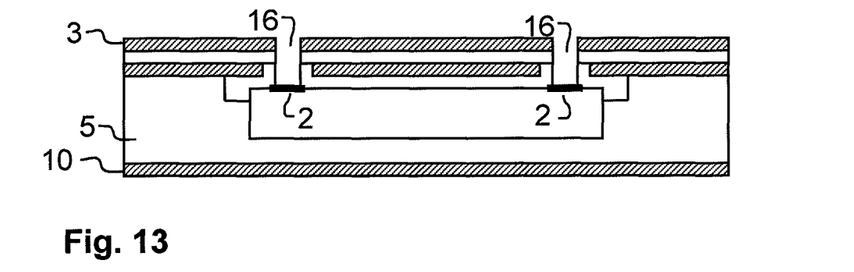
FIG. 13 presents a further intermediate processing step after the step of FIG. 12.

Next, the chip 1 is embedded in insulating material that forms part of the dielectric 5. This is shown in FIG. 13. The added insulating material may be prepreg, for instance. A copper foil is also laminated into the structure to form the first wiring layer 3. This copper foil is separated from the second wiring layer 7 by a layer of dielectric material, as in the above-disclosed embodiments. It is also possible to laminate at least one further copper foil into the structure in order to form a further wiring layer, such as the third wiring layer 10 according to the embodiments of FIGS. 2 to 6.

Next, contact holes 16 are made by means of a laser, for instance. The contact holes 16 are opened up to the surface of the contact lands 2 or other contact terminals, such as contact bumps. The structure after this step is shown in FIG. 13.

Figure 14:
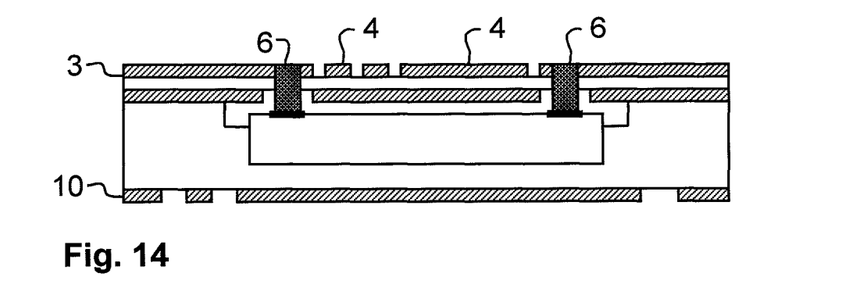
FIG. 14 presents a further processing step after the step of FIG. 13.

After the phase of FIG. 13, a micro via metallization process is performed, as shown in FIG. 14. This can be done as discussed above by reference to FIG. 10. FIG. 14 shows also that the first and third wiring layers 3 and 10 are patterned to form conducting lines and other desired conductor patterns, such as conducting plates.

Also other methods can be used in manufacturing the electronic modules according to the embodiments. Examples of such other possible methods include modifications of the methods described in the U.S. patent application Ser. Nos. 10/550,023, 10/572,340, 11/659,190, 11/570,673, 11/667,429, 11/791,547, 11/587,586 and 11/917,711, which are incorporated herein by reference.

Figure 15:
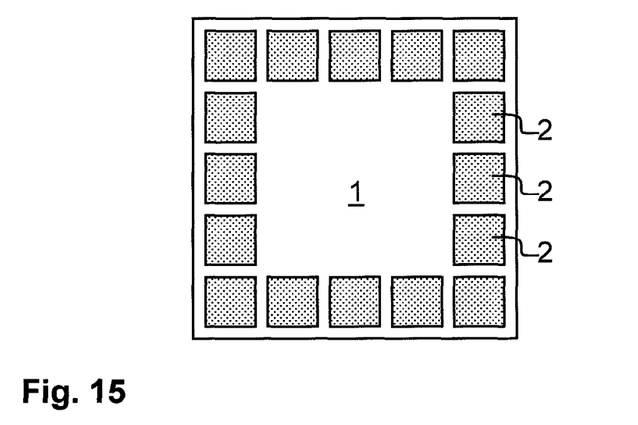
FIG. 15 presents a schematic drawing of an active surface of a component in one possible configuration.
Figure 16:
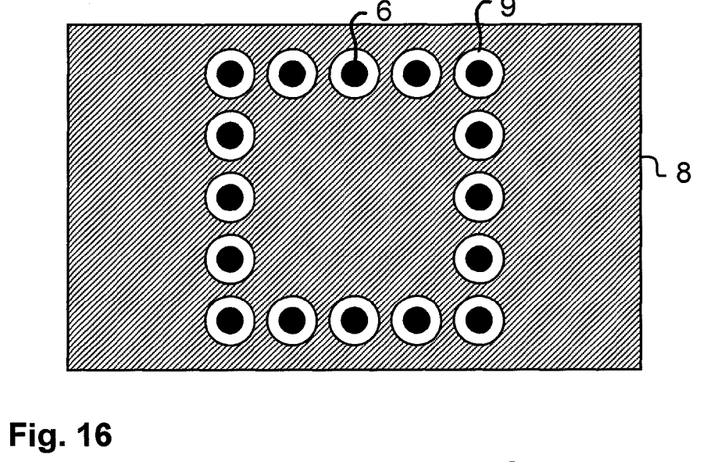
FIG. 16 presents a schematic drawing of one possible configuration of a ground layer and contact elements when using the component of FIG. 15.

FIG. 15 shows a schematic drawing of one possible contact land 2 configuration on the active surface of the chip 1. FIG. 16 shows one possible design of the first conducting pattern 8 and the openings 9 that can be used together with the chip of FIG. 15. FIG. 16 is a cross-section along the second wiring layer 7 of the electronic module. FIG. 15 could, in principle, present a cross-section taken from any one of the electronic modules of FIGS. 1 to 6, for instance. As shown in FIG. 16, this embodiment has an individual opening 9 for each of the contact elements 6.

Figure 17:
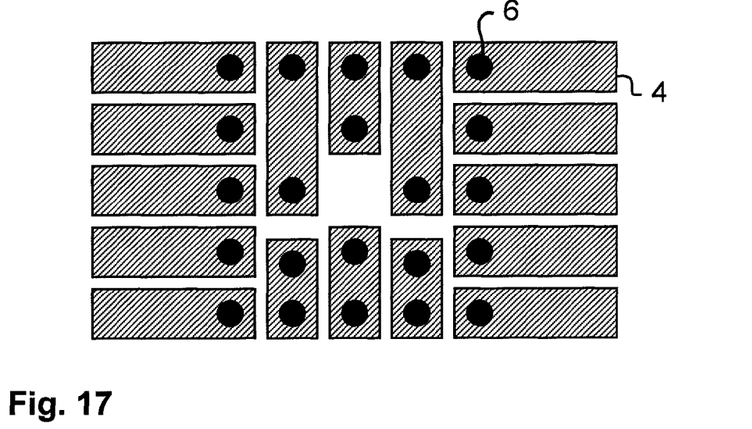
FIG. 17 presents a schematic drawing of one possible configuration of a signal wiring layer and the contact elements when using the component of FIG. 15.

FIG. 17 depicts one possible configuration of the conducting lines 4 that can be used together with the configuration of the contact elements 6 shown in FIG. 16.

Figure 18:
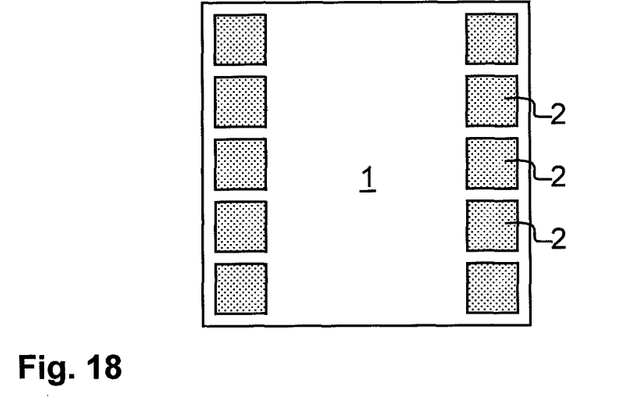
FIG. 18 presents a schematic drawing of an active surface of another component in another possible configuration.
Figure 19:
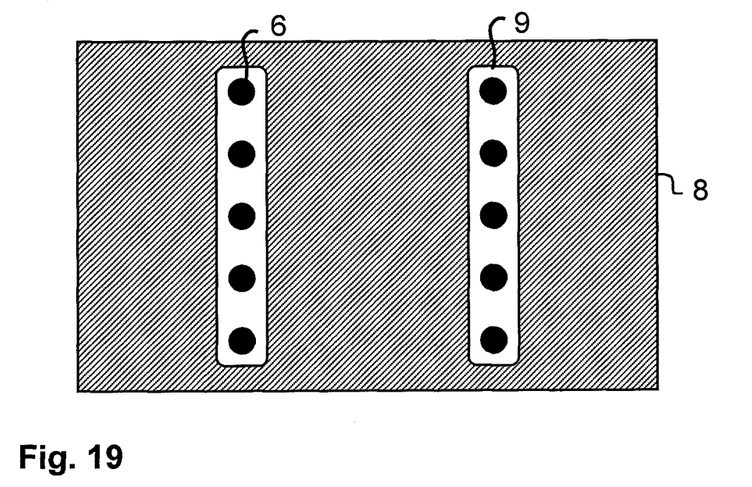
FIG. 19 presents a schematic drawing of one possible configuration of a ground layer and contact elements when using the component of FIG. 18.

FIG. 18 shown a schematic drawing of another possible contact land 2 configuration on the active surface of the chip 1. FIG. 19 shows one possible design of the first conducting pattern 8 and the openings 9 that can be used together with the chip of FIG. 15. As in the case of FIG. 16, FIG. 19 is a cross-section along the second wiring layer 7 of the electronic module and could present a cross-section taken from FIGS. 1 to 6. As shown in FIG. 19, this embodiment has two groove-like openings 9 and more than one of the contact elements 6 pass through both of the groove-like openings 9.

Figure 20:
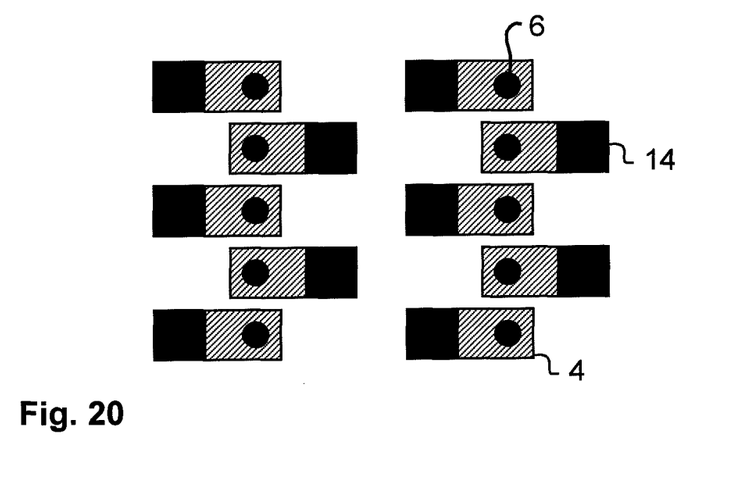
FIG. 20 presents a schematic drawing of one possible configuration of signal wiring layer, contact elements and terminal pads when using the component of FIG. 18.

FIG. 20 depicts one possible configuration of the conducting lines 4 that can be used together with the configuration of the contact elements 6 shown in FIG. 19. FIG. 20 shows also terminal pads 14 manufactured on the conducting lines 4. Thus, FIGS. 18 to 20 show that it is possible to manufacture very compact component packages, for instance, wherein terminal pads 14 can be located even at the location of the chip 1. As the component package includes the first conducting pattern 8 between the chip 1 and the conducting lines 4, this compact design can made without the risk of cross talk between the signals lead through the terminal pads 14 and the chip 1 itself.

The dimensions of the various elements of the electronic modules can be selected according to the requirements of the application for which the embodiments are designed. The drawings of this document have not been drawn is scale but have been drafted for the purpose of illustrating the mutual relations of the relevant features according to the embodiments. However, some non-binding guidelines for the relevant dimensions are discussed in the following with reference to FIG. 21. The disclosed dimensions can be used also in the embodiments of FIGS. 1 to 20 discussed above, and as starting points for developing electronic modules for various applications.

Figure 21:
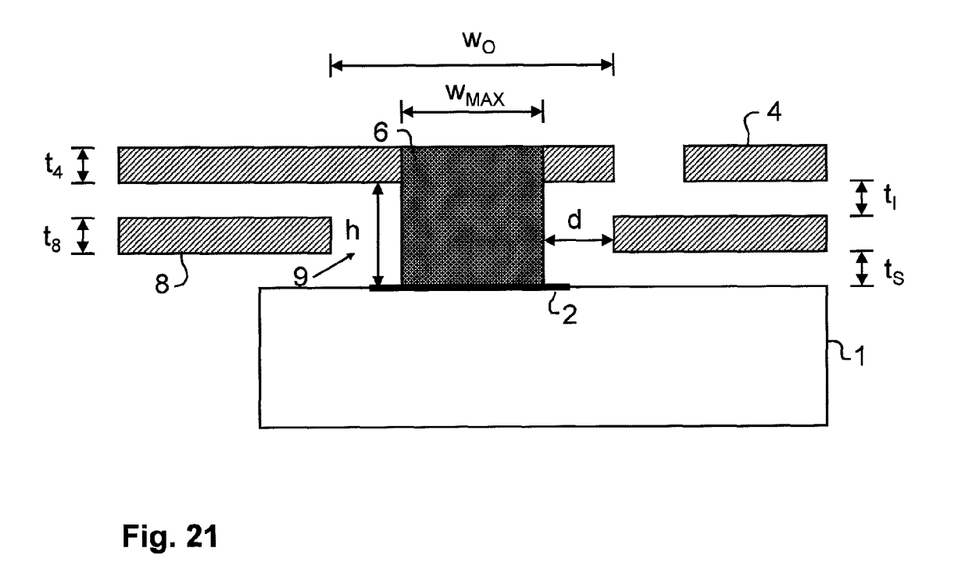
FIG. 21 presents a cross section of one contact according an embodiment.

First let as assume an embodiment, wherein each of the openings 9 in the electronic module are defined by a perimeter surface formed in the first conducting pattern 8. In case the second wiring layer 7 is planar, such a perimeter surface is typically approximately normal to the plane of the second wiring layer 7. The perimeter surface may have been formed by drilling a hole for the opening 9, for instance. As the contact elements 6 pass through the openings 9, each of the contact elements 6 comprises an outer surface facing the respective perimeter surface.

As already describe above, the contact elements 6 are not in contact with, but are separated from, the first conducting pattern 8, there is a spacing d between each perimeter surface and the respective outer surface of the contact element 6. The spacing d is typically less than 100 micrometers. Good values for many applications can be selected within the range 10-50 micrometers. In case the shape of the opening 9 is not identical to the shape of the cross-section of the contact element 6, or if the contact element 6 is not located in the centre of the opening 9, the spacing d is different in different directions around the contact element 6. Thus, the spacing d is a function of direction or angle. In such cases, both the minimum spacing $d_{min}$ and the maximum spacing $d_{max}$ can be selected, for example, according to the above criteria. Of course, the minimum $d_{min}$ spacing could also be designed shorter, such as 5 micrometers, for instance.

In embodiments in which a plurality of contact elements 6 pass through one individual opening 9, it is most practical to define the spacing d such as it is the distance from each point on the perimeter surface to the closest outer surface of the contact element 6. Then, the above guidelines can be followed at least as starting points for design.

FIG. 21 shows also a spacing 0 between the chip 1 and the first conducting pattern 8 in the second wiring layer 7. The spacing s can be less than 30 micrometers, for instance. Good values are, for example, 5 to 20 micrometers. In the example of FIG. 21, the spacing s is 10 micrometers.

As already discussed above, each of the contact elements 6 has a height (height h) from the respective contact land 2 to the respective the conducting line 4. The height h can be, for example, less than 70 micrometers. Good values can be selected from the range 10-30 micrometers, for instance. In the example of Figure, height h is 20 micrometers. As already discussed above, the height of the metallurgical element serving as the contact element 6 may differ from the height h as defined above. In the example of FIG. 21, the height of such metallurgical element is $h+t_4$.

Each of the contact elements 6 has also a maximum width $w_{max}$ in the direction parallel to the surface of the chip 6 and the respective contact land 2. This maximum width $w_{max}$ said can be selected, for example, less than 50 micrometers. Of course, it is possible to manufacture contact elements 6 with greater width but the embodiments make it also possible to produce very narrow contact elements 6. The width $w_{max}$ can be, for example, selected from the range of 20-40 micrometers. In the example of FIG. 21, the width $w_{max}$ is 30 micrometers. In the example, the maximum width $w_{max}$ is practically equal to the minimum width $w_{max}$ of the contact element 6, because the contact elements 6 are round. In case the contact elements 6 are of some other form, for instance rectangular, both the maximum width $w_{max}$ and the minimum width $w_{min}$ could be selected within the above-defined ranges. As understood by a skilled reader, the shape refers now to the shape of the cross-section along a plane that is perpendicular to the height h.

FIG. 21 shows also the width $w_o$ of the opening 9. This can be determined from the relevant width of the contact element 6 and the required spacing d on both sides of the contact element 6. In case of annular openings 9 each accommodating one round contact element 6, the width $w_o$ could be in the range of 30-100 micrometers. In the example of FIG. 21, the width $w_o$ is 50 micrometers.

Other dimensions shown in FIG. 21 are thicknesses $t_4$, $t_8$ and $t_i$. Thicknesses $t_4$ and $t_8$ may be less than 10 micrometers, for example in the range of 3-5 micrometers. In the example of FIG. 21, $t_4$ is 5 micrometers and $t_8$ is 3 micrometers. Thickness t, can be, for example less than 20 micrometers, such as in the range of 5-10 micrometers. In the example of FIG. 21, $t_8$ is 7 micrometers.

As is apparent from the above discussion, the first wiring layer 3 can be designed to protect the component from electromagnetic interference by signals conducted in the conducting lines 4 of the first wiring layer 3. In one such embodiment, the component 1 is a semiconductor chip and the first and second wiring layers 3, 7 are substantially planar and parallel. Furthermore, the portion of the conducting pattern located between the component 1 and the first wiring layer 3 is substantially unbroken in order to protect the semiconductor component from electromagnetic interference by signals conducted in the conducting lines 4 of the first wiring layer 3.

According to another embodiment for protecting the component from electromagnetic interference by signals in the first wiring layer 3, the component 1 has a first surface facing the first wiring layer 3 and at least some of the contact terminals 2 are on the first surface. The first surface has a first area and the first conducting pattern defines a plate having a second area greater than said first area. Furthermore, the plate includes the portion of the conducting pattern located between the component 1 and the first wiring layer 3 and is provided with at least one opening 9 through which the contact elements 6 pass.

The above description is only to exemplify the invention and is not intended to limit the scope of protection offered by the claims. The claims are also intended to cover the equivalents thereof and not to be construed literally.

The invention claimed is:

1. An electronic module, comprising
   a component having contact terminals;
   a first wiring layer comprising first conducting lines;
   a dielectric between the component and the first wiring layer, as well as around the component such that the component is embedded in the dielectric;
   contact elements providing electrical connection between at least some of the contact terminals and at least some of the first conducting lines;
   a second wiring layer inside the dielectric and having a first conducting pattern, wherein a first portion of the first conducting pattern is located between the component and the first wiring layer, wherein said first portion is configured to be connected to a ground potential to protect the component from electromagnetic interference, and a second portion of the first conducting pattern has second conducting lines for conducting electrical signals or supply voltage;
   second contact elements providing electrical connection between at least some of the first conducting lines and the second conducting lines; and
   terminal pads on the first conducting lines and electrically connected to the component.

2. The electronic module of claim 1, wherein the component is a microchip including microelectronic devices, and the portion of the first conducting pattern is located between the microelectronic devices and at least one of the first conducting lines in the first wiring layer.

3. The electronic module of claim 1, comprising a third wiring layer such that the component is enclosed between the second and third wiring layers, said third wiring layer comprising a second conducting pattern.

4. The electronic module of claim 3, comprising vertical conductors connecting the second conducting pattern and the first conducting pattern, thereby forming a shield around the component against electromagnetic interference.

5. The electronic module of claim 1, wherein the dielectric comprises at least two layers of dielectric material.

6. The electronic module of claim 1, wherein the dielectric encloses the component, the first conducting lines, the contact elements and the first conducting pattern as an embedded circuit structure.

7. The electronic module of claim 1, wherein the first conducting pattern defines at least one opening, and the contact elements pass through said at least one opening.

8. The electronic module of claim 7, wherein said at least one opening comprises an individual opening for each of the contact elements.

9. The electronic module of claim 7, wherein at least two of the contact elements pass through a common opening.

10. The electronic module of claim 7, wherein
for each of the openings, the first conducting pattern comprises a perimeter surface defining the opening;
each of the contact elements comprises an outer surface facing the respective perimeter surface; and
there is a spacing between each perimeter surface and the respective outer surface, said spacing being less than 100 micrometers, for example 5 to 50 micrometers.

11. The electronic module of claim 1, wherein the spacing between the component and the first conducting pattern in the second wiring layer is 5 to 20 micrometers.

12. The electronic module of claim 1, wherein each of the contact elements has a height from the respective contact terminal to the respective the conducting line, said height being less than 70 micrometers, for example 10 to 30 micrometers.

13. The electronic module of claim 1, wherein each of the contact elements has a maximum width in the direction parallel to the surface of the component and the respective contact terminal, said width being less than 50 micrometers, for example 20 to 40 micrometers.

14. The electronic module of claim 1, wherein
the first and second wiring layers are planar and parallel; and
the contact elements extend straight from the contact terminals to the respective conducting lines in a direction perpendicular to the planar first and second wiring layers.

15. The electronic module of claim 1, wherein the component is a microcircuit and the contact terminals are contact bumps fabricated on contact lands on a surface of the microcircuit.

16. The electronic module of claim 1, wherein the component is a bumpless microcircuit and the contact terminals are contact lands on a surface of the microcircuit.

17. The electronic module of claim 1, wherein
the component is a semiconductor chip,
the first and second wiring layers are substantially planar and parallel, and
the portion of the first conducting pattern located between the component and the first wiring layer is substantially unbroken in order to protect the semiconductor component from electromagnetic interference by signals conducted in first the conducting lines of the first wiring layer.

18. The electronic module of claim 1, wherein
the component has a first surface facing the first wiring layer and having a first area,
at least some of the contact terminals are on the first surface,
the first conducting pattern defines a plate having a second area greater than said first area,
said plate includes the portion of the conducting pattern located between the component and the first wiring layer, and
said plate is provided with at least one opening, and
the contact elements pass through said at least one opening.

19. The electronic module of claim 1, wherein the terminal pads are at the location of the component.

20. An electronic module, comprising
a first wiring layer comprising first conducting lines;
a semiconductor chip with a first surface and contact terminals on the first surface, the first surface having a first area and facing the first wiring layer;
a second wiring layer defining a plate having a second area at least as great as said first area, at least a first part of the plate being located between the semiconductor chip and the first wiring layer and having at least one opening, the at least first part is configured to be connected to a ground potential to protect the semiconductor chip from electromagnetic interference, and a second part comprising second conducting lines for conducting electrical signals or supply voltage;
contact elements extending through said at least one opening in the plate without contacting the plate, the contact elements providing electrical connection between at least some of the contact terminals and at least some of the first conducting lines, each of the contact elements being a solid metal structure and in metallurgical contact with the respective contact terminal and the respective conducting line;
second contact elements providing electrical connection between at least some of the first conducting lines and the second conducting lines;
dielectric between the semiconductor chip and the second wiring layer, as well as between the first wiring layer and the second wiring layer, the dielectric being present also in said at least one opening in the plate for electrically isolating each of the contact elements from said plate; and
terminal pads on the first conducting lines and electrically connected to the component.

* * * * *